United States Patent [19]

Miles et al.

[11] Patent Number: 5,451,552
[45] Date of Patent: Sep. 19, 1995

[54] METHOD FOR IMPROVEMENT OF OPTICAL QUALITY AND REDUCTION OF BACKGROUND DOPING IN GAINSB/INAS SUPERLATTICES

[75] Inventors: Richard H. Miles, Los Angeles; David H. Chow, Newbury Park, both of Calif.

[73] Assignee: Hughes Aircraft Company, Los Angeles, Calif.

[21] Appl. No.: 245,190

[22] Filed: May 13, 1994

[51] Int. Cl.$^6$ .................... H01L 21/324; H01L 21/203
[52] U.S. Cl. .................... 437/248; 437/107; 437/945; 148/DIG. 65
[58] Field of Search ............ 437/107, 3, 248; 148/DIG. 65

[56] References Cited

U.S. PATENT DOCUMENTS

| | | | |
|---|---|---|---|
| 3,992,233 | 11/1976 | Farrow | 148/DIG. 65 |
| 4,190,486 | 2/1980 | Kyle | 437/248 |
| 4,421,577 | 12/1983 | Spicer | 437/107 |
| 4,585,491 | 4/1986 | Burnham et al. | |
| 4,771,010 | 9/1988 | Epler et al. | |
| 4,960,720 | 10/1990 | Shimbo | 437/107 |
| 5,137,847 | 8/1992 | Shimakura et al. | 437/248 |
| 5,238,868 | 8/1993 | Elman et al. | |
| 5,254,507 | 10/1993 | Shimakura et al. | 148/DIG. 65 |

FOREIGN PATENT DOCUMENTS

| | | | |
|---|---|---|---|
| 564915A2 | 10/1993 | European Pat. Off. | 437/107 |
| 54-63672 | 5/1979 | Japan | 437/107 |
| 61-222993 | 10/1986 | Japan | |
| 1-235333 | 9/1989 | Japan | 437/248 |

OTHER PUBLICATIONS

D. H. Chow et al, Journal of Crystal Growth, vol. 111, pp. 683–687 (1991).

I. H. Campbell et al, Applied Physics Letters, vol. 59, pp. 846–848 (1991).

J. L. Davis, Journal of Vacuum Science and Technology B, vol. 11, No. 3, pp. 861–863 (May/Jun. 1993).

*Primary Examiner*—Brian E. Hearn
*Assistant Examiner*—Leon Radomsky
*Attorney, Agent, or Firm*—Vijayalakshmi D. Duraiswamy; Wanda K. Denson-Low

[57] ABSTRACT

Post-growth annealing of GaInSb/InAs superlattices at about 400° to 650° C. in an antimony flux followed by cooling results in enhanced optical properties as determined by photoluminescence and in reduced background doping levels as determined by Hall measurements. Accordingly, the annealing procedure represents an advantage over previous fabrication techniques for $Ga_{1-x}In_xSb/InAs$ superlattices.

15 Claims, 1 Drawing Sheet

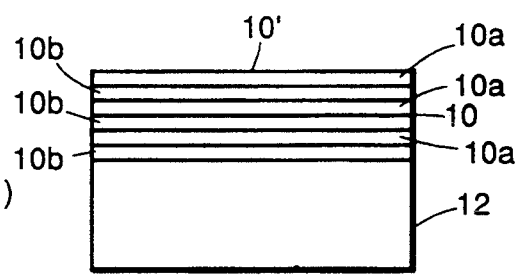
FIG. 1.
(PRIOR ART)
FIG. 2.
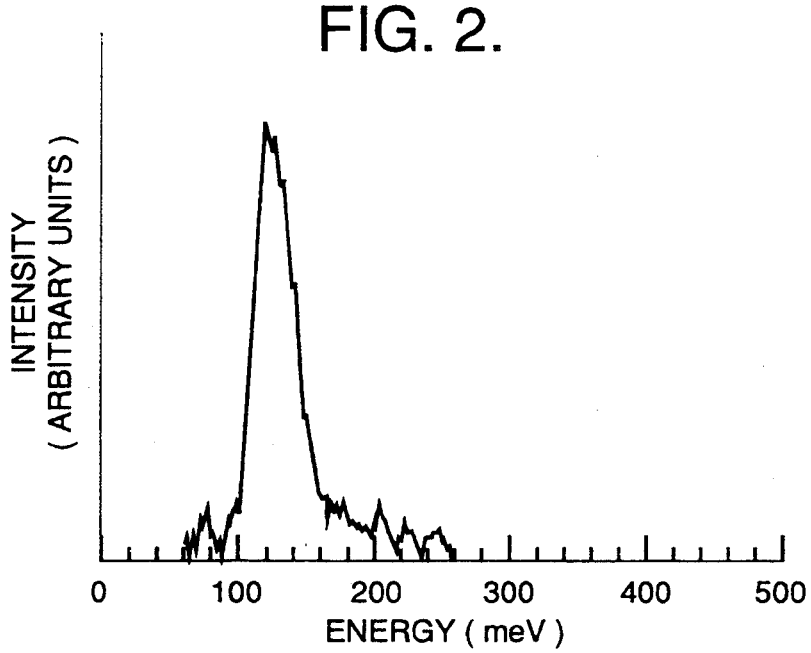
FIG. 3.
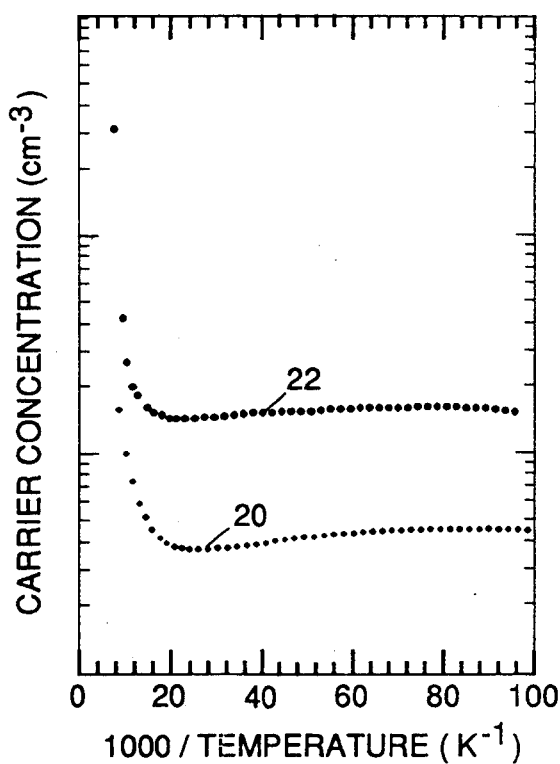

METHOD FOR IMPROVEMENT OF OPTICAL QUALITY AND REDUCTION OF BACKGROUND DOPING IN GAINSB/INAS SUPERLATTICES

This invention was made with Government support under Contract No. N00014-89-C-0203 awarded by the Department of the Navy. The Government has certain rights in this invention.

BACKGROUND OF THE INVENTION

1. Field of the Invention

The present invention relates generally to optical and electronic devices, and, more particularly, to processes for improving the optical properties of GaInSb/InAs materials employed in infrared lasers and detectors.

2. Description of Related Art $Ga_{1-x}In_xSb$/InAs superlattices are candidate materials for future generation infrared detectors and lasers from mid- to very long-wavelengths (3 to 5 μm and beyond). The optimum substrate temperature (as determined by surface morphology and x-ray diffraction) for fabrication of these superlattices by molecular beam epitaxy is below 400° C.; see, e g., D. H. Chow et al, "Growth of InAs/$Ga_{1-x}In_xSb$ infrared superlattices," *Journal of Crystal Growth*, Vol. 111, pp. 683–687 (1991); I. H. Campbell et al, "Far-infrared photoresponse of the InAs/GaInSb superlattice", *Applied Physics Letters*, Vol. 59 (7), pp. 846–848 (1991); and J. L. Davis, "Optimum growth temperature determination for GaInSb/InAs strained layer superlattice", *Journal of Vacuum Science and Technology B*, Vol. 11, No. 3, 861–863 (May/June 1993).

The Chow et al publication outlines a molecular beam epitaxy (MBE) growth procedure which yields $Ga_{1-x}In_xSb$/InAs superlattices with good surface morphology, but poor photoluminescence efficiency and high background doping levels. Photoluminescence efficiency (as it relates to minority carrier lifetime) and low background doping are both key material properties for the realization of high performance optical and electronic devices such as infrared detectors and lasers.

Thus, there is a need to provide GaInSb/InAs superlattice materials having improved photoluminescence efficiency and low background doping.

SUMMARY OF THE INVENTION

In accordance with the present invention, post-growth annealing of the superlattices in an antimony flux results in enhanced optical properties as determined by photoluminescence and in reduced background doping levels as determined by Hall measurements.

In particular, the method of the invention for treating a $Ga_{1-x}In_xSb$/InAs superlattice formed on a III-V substrate comprises:

(a) heating the substrate to a temperature within the range of about 400° to 650° C.;

(b) providing a flux of antimony species onto a surface of the $Ga_{1-x}In_xSb$/InAs superlattice;

(c) maintaining the substrate at the temperature and the flux of antimony atoms onto the superlattice surface for a period of time sufficient to reduce the density of as-grown point defects; and (d) cooling the substrate to room temperature.

The annealing procedure of the present invention results in improved optical quality and in reduction of background doping. Accordingly, the annealing procedure represents an advantage over previous fabrication techniques for $Ga_{1-x}In_xSb$/InAs superlattices.

BRIEF DESCRIPTION OF THE DRAWINGS

FIG. 1 is a schematic layer sequence diagram of a GaInSb/InAs superlattice;

FIG. 2, on coordinates of intensity (arbitrary units) and energy (in meV), is a plot of photoluminescence measured for a superlattice treated in accordance with the annealing process of the present invention; and FIG. 3, on coordinates of carrier concentration (in $cm^{-3}$) and inverse temperature (in $K^{-1}$), shows plots of Hall effect data taken from one superlattice treated in accordance with the annealing process of the present invention and from one superlattice untreated (grown using the prior art MBE process alone).

DESCRIPTION OF THE PREFERRED EMBODIMENTS

The present invention is directed to a procedure which improves the optical quality and reduces background doping in $Ga_{1-x}In_xSb$/InAs superlattices grown on substrates. These results are of significance for the attainment of high performance devices such as infrared detectors and lasers based on $Ga_{1-x}In_xSb$/InAs superlattices. In the compound semiconductor, x may range from 0 to 1, thereby providing superlattice compositions ranging from GaSb/InAs to InSb/InAs. Typically, the layers comprising the superlattice range from about 3 to 100 Å in thickness, with at least two periods.

FIG. 1 is a schematic layer sequence diagram which illustrates schematically the structure obtained by prior art processes used to fabricate $Ga_{1-x}In_xSb$/InAs superlattices 10, comprising alternating layers of InAs 10a and $Ga_{1-x}In_xSb$ 10b. This structure has been previously published in the prior art by several different authors.

The superlattices 10 are grown either on nearly lattice-matched III-V substrates 12, such as GaSb or InAs substrates, or on thick stress-relaxed GaSb buffer layers on GaAs or InP substrates (not shown). The superlattices may also be grown on silicon substrates. In any event, unusually low InAs growth rates are used (approximately 0.2 monolayers per second) to minimize cross-incorporation of arsenic in the antimonide layers and to maintain a reasonable $Ga_{1-x}In_xSb$ growth rate.

Any of the known prior art techniques for growing the superlattices 10 may be employed in the practice of the present invention. Such prior art techniques include molecular beam epitaxy (MBE), metal organic MBE (MOMBE), chemical vapor deposition (CVD), and chemical beam epitaxy (CBE) and variants thereof.

It has been determined empirically that the superlattices 10 must be deposited at low substrate temperatures (<400° C.) to obtain good surface morphology and structural quality. However, growth at these low substrate temperatures tends to result in defects (such as antisite defects, interstitials, and vacancies) incorporated into the structures, leading to high background doping levels and strong nonradiative recombination channels. As these properties are deleterious to detector and laser performance, it is desirable to reduce the density of as-grown point defects. The procedure of the present invention accomplishes this goal.

The procedure disclosed here is as follows: (a) the $Ga_{1-x}In_xSb$/InAs superlattice 10 is deposited using a prior art process such as that described above; (b) the substrate temperature is raised to an annealing temperature in a vacuum environment while maintaining an incident Sb-flux on the superlattice surface 10'; (c) the annealing temperature and incident Sb-flux are maintained for a period of time sufficient to reduce the density of as-grown point defects; and (d) the substrate is cooled in the incident Sb-flux and then to room temperature. The cooling to room temperature may be performed in the ultrahigh vacuum environment or ex situ.

The annealing temperature employed in the practice of the present invention ranges from about 400° to 650° C. The lower limit is constrained by considerations related to time: a temperature of less than about 400° C. would require too long a time of annealing to be practical. The upper limit is constrained by the loss of integrity of the superlattice 10 as the layers begin mutual interdiffusion. Preferably, the annealing temperature is about 500° C.

The antimony flux is intended to suppress loss of Sb from the superlattice by vaporization; such loss would generate defects in the superlattice structure. The amount of the flux is based on the known vapor pressure of Sb at the annealing temperature, and is typically at least about twice the calculated loss of Sb. The flux of antimony species may comprise monomers, dimers, and tetramers, and mixtures thereof.

The time that the sample is maintained at the annealing temperature depends on the annealing temperature. Lower annealing temperatures require more annealing time, while higher annealing temperatures permit shorter annealing time. Consistent with these considerations, the annealing time may range from about 10 seconds to 24 hours. At an annealing temperature of 500° C., an annealing time of about 30 minutes is appropriate.

Neither the rate of heating to the annealing temperature nor the rate of cooling appears to be very critical. However, heating and cooling rates on the order of 0.2 to 1° C./sec have been found to be sufficient.

The Sb-flux does not need to be maintained below about 350° C. since the loss of Sb at that temperature is minimal. Accordingly, the Sb-flux may be turned off when the substrate reaches that temperature during cooling. Indeed, if the substrate is too cool, metallic Sb will be formed on the surface, which is undesirable.

Once the Sb-flux is turned off, the cooling may proceed under the vacuum conditions employed during the annealing. The vacuum is typically in the range of $10^{-8}$ to $10^{-10}$ Torr, which is the range employed during MBE deposition of the superlattice. However, use of a vacuum during annealing does not appear to be critical, and the annealing may alternatively be done ex situ.

Subsequent layers (requiring substrate temperatures below 500° C.) may be deposited prior to step (d), if desired. For example, a thin GaSb or InAs layer (not shown), approximately 50 to 1,000 Å in thickness, may be grown on top of the superlattice layer 10 as a cap layer. Such a cap layer is well-known for its use in preventing charge separation at the exposed surface 10' of the superlattice layer 10.

The annealing procedure of the invention serves to eliminate certain point defects by increasing bulk diffusion in the as-grown superlattice. For example, Group-III-on-Sb-site defects may be eliminated by exchanging the misplaced Group III atom with an Sb-atom from the incident flux.

FIG. 2 displays photoluminescence data obtained from a superlattice grown with the herein-disclosed procedure, the data having been measured at a temperature of 5K. The nominal growth parameters for the superlattice were 13 monolayers of InAs 10a and 8 monolayers of $Ga_{0.75}In_{0.25}Sb$ 10b, repeated 40 times for a total film thickness of approximately 0.25 μm. X-ray diffraction revealed a superlattice period close to that expected from the nominal parameters. A strong photoluminescence peak was observed near 10 μm (120 meV), consistent with band edge emission from the structure (the energy gap of the structure was independently determined by spectral photoconductivity). Samples grown without the use of the disclosed procedure displayed no photoluminescence beyond 8 μm (155 meV).

The presence of the peak near 10 μm permits its use as a practical diagnostic tool in determining the effectiveness of annealing. Its absence indicates that the particular annealing conditions were not effective. This provides a relatively simple evaluation procedure without undue experimentation.

FIG. 3 displays Hall effect data taken from one superlattice grown with the disclosed procedure of the present invention (Curve 20) and another superlattice grown without the disclosed procedure (Curve 22). Both superlattice structures were grown using the prior art MBE process. The background carrier concentration observed in the sample grown with the annealing procedure of the present invention is more than a factor of two smaller, dropping to a value of $4 \times 10^{15}$ cm$^{-3}$ at 10K.

The data disclosed in FIGS. 2 and 3 depict the advantages of annealing in accordance with the invention over the prior art unannealed samples. In particular, the reduction in carrier concentration illustrated in FIG. 3 will result in longer depletion lengths in photovoltaic detectors, directly improving their performance. Further, as illustrated by the photoluminescence of FIG. 2, the reduced carrier density significantly increases carrier lifetimes, both by raising fundamental Auger lifetimes and by suppressing Shockley-Reed-Hall nonradiative recombination processes. Increasing lifetime directly improves the performance of a photoconductive or photovoltaic detector (for either class of detector operated in a non-background-limited mode, detectivity $D^* \propto \tau^{\frac{1}{2}}$, except in the case of photovoltaic detectors for which the diffusion length is less than the thickness of the active layer, in which case $D^* \propto \tau^{\frac{1}{4}}$, where T is the carrier lifetime)

The present invention applies to the general area of infrared imaging systems, such as passive forward-looking infrared (FLIR) systems, electro-optical missile seekers, and imaging cameras. Potential commercial applications include environmental monitoring and industrial process control systems based on infrared imaging. For all of these applications, GaInSb/InAs superlattice infrared detectors and lasers offer an alternative to present state-of-the-art HgCdTe detectors with significant system advantages if their performance nears theoretical predictions. The present invention is an important step toward such performance. Laser systems based on mid-wave IR lasers may be used in hydrocarbon monitoring, such as pollution emissions from vehicles and refineries.

Thus, there has been disclosed an annealing procedure which improves the optical quality and reduces background doping in $Ga_{1-x}In_xSb/InAs$ superlattices. It will be readily apparent to those skilled in this art that various changes and modifications of an obvious nature may be made, and all such changes and modifications are considered to fall within the scope of the present invention, as defined by the appended claims.

What is claimed is:

1. A method for treating a $Ga_{1-x}In_xSb/InAs$ superlattice, where x ranges from 0 to 1, formed on a substrate, to reduce as-grown point defects and to improve optical quality as measured by photoluminescence and to reduce background doping as measured by Hall effect, said method comprising:
   (a) heating said substrate to a temperature within the range of about 400° to 650° C.;
   (b) providing a flux of antimony species onto a surface of said $Ga_{1-x}In_xSb/InAs$ superlattice;
   (c) maintaining said substrate at said temperature and said flux of antimony species onto said superlattice surface for a period of time sufficient to reduce said as-grown point defects and sufficient to result in the appearance of a photoluminescence peak; and
   (d) cooling said substrate to room temperature.

2. The method of claim 1 wherein said temperature is about 500° C.

3. The method of claim 1 wherein said period of time ranges from about 10 seconds to 24 hours.

4. The method of claim 3 wherein said period of time is about 30 minutes.

5. The method of claim 1 wherein said flux of antimony species provides an over-pressure of antimony sufficient to suppress any evaporation of antimony from said superlattice.

6. The method of claim 5 wherein said flux of antimony species is at least twice the amount of any said evaporation.

7. The method of claim 1 wherein said flux of antimony species is maintained during cooling.

8. The method of claim 7 wherein said flux of antimony species is turned off when said substrate reaches a temperature of about 350° C.

9. The method of claim 1 wherein said flux of antimony species comprises at least one species selected from the group consisting of monomers, dimers, and tetramers of antimony.

10. The method of claim 1 wherein said method is carried out in an ultrahigh vacuum ranging from about $10^{-8}$ to $10^{-10}$ Torr.

11. The method of claim 1, wherein:
    said substrate is a III-V substrate;
    step (a) comprises heating said substrate to a temperature of 500° C.; step (b) provides an overpressure of antimony sufficient to suppress any evaporation of antimony from said superlattice;
    said period of time in step (c) is about 30 minutes; and
    said flux of antimony species is maintained in step (d) until said substrate reaches about 350° C., after which said flux of antimony species is turned off, and said substrate continues to cool to room temperature.

12. The method of claim 11 wherein said flux of antimony species is at least twice the amount of any said evaporation.

13. The method of claim 11 wherein said flux of antimony species comprises at least one species selected from the group consisting of monomers, dimers, and tetramers of antimony.

14. The method of claim 11 wherein said method is carried out in an ultrahigh vacuum ranging from about $10^{-8}$ to $10^{-10}$ Torr.

15. A method for treating a $Ga_{1-x}In_xSb/InAs$ superlattice, where x ranges from 0 to 1, formed on a substrate, to reduce as-grown point defects and to improve optical quality as measured by photoluminescence and to reduce background doping as measure by Hall effect, said method comprising:
   (a) heating said substrate to a temperature within the range of about 400° to 650° C.;
   (b) providing a flux of antimony species onto a surface of said $Ga_{1-x}In_xSb/InAs$ superlattice;
   (c) maintaining said substrate at said temperature and said flux of antimony species onto said superlattice surface for a period of time sufficient to reduce said as-grown point defects; and
   (d) cooling said substrate to room temperature,
   wherein said period of time is sufficient to result in the appearance of a photoluminescence peak at about 10 μm.

* * * * *